(12) United States Patent
Qian et al.

(10) Patent No.: US 12,342,517 B2
(45) Date of Patent: Jun. 24, 2025

(54) DISPLAY DEVICE, BENT SPACER MODULE AND ASSEMBLING METHOD THEREOF (71) Applicants: Chengdu BOE Optoelectronics Technology Co., Ltd., Sichuan (CN); BOE TECHNOLOGY GROUP CO., LTD., Beijing (CN)

(72) Inventors: Zhengkun Qian, Beijing (CN); Jing Chen, Beijing (CN); Chuanyan Lan, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 278 days.

(21) Appl. No.: 17/921,298

(22) PCT Filed: Jul. 5, 2021

(86) PCT No.: PCT/CN2021/104447
§ 371 (c)(1),
(2) Date: Oct. 25, 2022

(87) PCT Pub. No.: WO2022/042038
PCT Pub. Date: Mar. 3, 2022

(65) Prior Publication Data
US 2023/0171931 A1 Jun. 1, 2023

(30) Foreign Application Priority Data
Aug. 28, 2020 (CN) .......................... 202010883550.8

(51) Int. Cl.
H05K 9/00 (2006.01)
H05K 1/18 (2006.01)
H05K 7/20 (2006.01)

(52) U.S. Cl.
CPC ........... H05K 9/0054 (2013.01); H05K 1/189 (2013.01); H05K 7/20954 (2013.01); *H05K 2201/10128* (2013.01)

(58) Field of Classification Search
CPC .. H05K 9/0054; H05K 1/189; H05K 7/20954; H05K 2201/10128; H04M 1/0277; H04M 1/0266; G09F 9/00; G09F 9/30
See application file for complete search history.

(56) References Cited

U.S. PATENT DOCUMENTS 9,326,375 B2 * 4/2016 Lee .................. H05K 1/028
9,379,355 B1 * 6/2016 Lee .................. H10K 50/84
(Continued)

FOREIGN PATENT DOCUMENTS

CN 108305564 A 7/2018
CN 109272874 A 1/2019
(Continued)

*Primary Examiner* — Rockshana D Chowdhury
(74) *Attorney, Agent, or Firm* — HOUTTEMAN LAW LLC (57) ABSTRACT A display device, a bent spacer module and an assembling method thereof are provided. The display device includes: a protective cover plate; a display module, including a display surface facing the protective cover plate and a back surface away from the protective cover plate; a chip-on-film, at least part of the chip-on-film being located on the back surface and being in binding connection with an edge of the display module; a driving chip, which is located on a side, facing the display module, of the chip-on-film on the back surface, and is in binding connection with the chip-on-film; and a bent space, which is located between the driving chip and the back surface, a thickness of a part of the bent spacer contacting the driving chip being greater than that of the remaining part of the bent spacer.

18 Claims, 5 Drawing Sheets (56) References Cited

U.S. PATENT DOCUMENTS

| | | | |
|---|---|---|---|
| 9,673,423 B2* | 6/2017 | Lee | H10K 59/12 |
| 10,388,713 B2* | 8/2019 | Son | H10K 50/86 |
| 10,418,389 B2* | 9/2019 | Lee | H10K 59/8791 |
| 11,029,546 B2* | 6/2021 | Wang | H01L 23/4985 |
| 11,877,497 B2* | 1/2024 | Zhu | H10K 59/40 |
| 2013/0148312 A1* | 6/2013 | Han | H05K 1/028 361/736 |
| 2014/0092034 A1* | 4/2014 | Franklin | H05K 1/028 345/173 |
| 2015/0021570 A1* | 1/2015 | Kim | H10K 77/111 257/40 |
| 2015/0173176 A1 | 6/2015 | Lee | |
| 2019/0014671 A1* | 1/2019 | Ahn | H05K 1/028 |
| 2020/0020754 A1 | 1/2020 | Kim et al. | |

FOREIGN PATENT DOCUMENTS

| | | |
|---|---|---|
| CN | 109859632 A | 6/2019 |
| CN | 110491926 A | 11/2019 |
| CN | 110767092 A | 2/2020 |
| CN | 110799898 A | 2/2020 |
| CN | 202014063 A | 4/2020 |
| CN | 111292622 A | 6/2020 |
| CN | 111462634 A | 7/2020 |
| CN | 212276717 U | 1/2021 |
| WO | WO2022042038 A1 | 3/2022 |

\* cited by examiner

DISPLAY DEVICE, BENT SPACER MODULE AND ASSEMBLING METHOD THEREOF

CROSS-REFERENCE TO RELATED APPLICATION

The present application claims priority to Chinese patent application No. 202010883550.8, filed on Aug. 28, 2020, entitled "display device, bent spacer module and assembling method thereof", the entire contents of which are incorporated herein by reference.

TECHNICAL FIELD

The present disclosure relates to the technical field of display, in particular, to a display device, a bent spacer module, and an assembling method thereof.

BACKGROUND

With the increasing popularity of smart phones and wearable electronic products, people have higher requirements for the proportion of a screen (which may also be referred to as a screen-to-body ratio). Under the trend of full screen, a border of a display module (MDL) is narrower and narrower, the high requirements and strict control are especially required for a border where the display module is bound to a Chip On Film (COF).

SUMMARY

As an aspect, an embodiment of the present disclosure provides a display device, including: a protective cover plate; a display module including a display surface facing the protective cover plate and a back surface away from the protective cover plate; a COF, wherein at least a portion of the COF is located on the back surface and bound and connected with an edge of the display module; a driving chip on a side, proximal to the display module, of the COF on the back surface, and bound and connected with the COF; and a bent spacer between the driving chip and the back surface. A portion of the bent spacer in contact with the driving chip has a thickness greater than a thickness of the remaining portion of the bent spacer.

Optionally, in the display device in the embodiment of the present disclosure, the bent spacer includes a first film layer and a second film layer stacked on the first film layer, the second film layer is in contact with the driving chip, and an area of the second film layer is smaller than an area of the first film layer.

Optionally, in the display device in the embodiment of the present disclosure, the first film layer and the second film layer are formed as a one-piece structure.

Optionally, in the display device in the embodiment of the present disclosure, an orthographic projection of the second film layer on a plane where the driving chip is located overlaps the entire driving chip.

Optionally, in the display device in the embodiment of the present disclosure, along a direction perpendicular to a plane where the bent spacer is located, a sum of a thickness of the first film layer and a thickness of the second film layer is greater than or equal to 0.2 mm.

Optionally, in the display device in the embodiment of the present disclosure, the edge of the display module bound with the COF is bent towards the back surface such that the entire COF is on the back surface.

Optionally, in the display device in the embodiment of the present disclosure, an edge of the COF is bound and connected with the edge of the display module on the display surface, and an opposite edge of the COF is bent to the back surface from the display surface.

Optionally, in the display device in the embodiment of the present disclosure, along a direction of a bending axis, a width of the first film layer is the same as a width of the second film layer.

Optionally, in the display device in the embodiment of the present disclosure, each of the first film layer and the second film layer has a width greater than or equal to 7 mm and less than or equal to 12 mm.

Optionally, in the display device in the embodiment of the present disclosure, a surface of the bent spacer away from a bending axis is a vertical surface.

Optionally, in the display device in the embodiment of the present disclosure, along a direction perpendicular to the vertical surface, a length of the first film layer is greater than or equal to 8 mm and less than or equal to 15 mm, and a length of the second film layer is greater than or equal to 3 mm and less than or equal to 7 mm.

Optionally, in the display device in the embodiment of the present disclosure, the display device in the embodiment of the present disclosure further includes a first back film and a heat dissipation layer sequentially on a side of the back surface proximal to the bent spacer, and a second back film on a side of the bent spacer away from the back surface. Along a direction perpendicular to a plane where the bent spacer is located, the first film layer has a thickness smaller than or equal to a difference between a bending diameter and a sum of a thickness of the first back film, a thickness of the heat dissipation layer and a thickness of the second back film.

Optionally, the display device in the embodiment of the present disclosure further includes a flexible circuit board bound and connected with the COF. The COF includes a first terminal bound and connected with the display module, and a second terminal bound and connected with the flexible circuit board, and both the first terminal and the second terminal are on a same side of the COF bound with the driving chip.

As another aspect, an embodiment of the present disclosure provides a bent spacer module including a bent spacer being the bent spacer in the display device described above; a first release film on a side of the bent spacer to be attached to the back surface of the display module; and a second release film on a side of the bent spacer to be attached to the driving chip.

Optionally, in the bent spacer module in embodiment of the present disclosure, the second release film includes a third film layer and a fourth film layer stacked on the third film layer. The fourth film layer is in contact with the first film layer, and the fourth film layer has an area smaller than an area of the third film layer. Along a direction perpendicular to a plane where the bent spacer is located, the fourth film layer has a thickness equal to a thickness of the second film layer, and an orthographic projection of the fourth film layer on the plane where the bent spacer is located does not overlap the second film layer.

Optionally, in the bent spacer module in embodiment of the present disclosure, the third film layer and the fourth film layer are formed as a one-piece structure.

Yet another aspect, an embodiment of the present disclosure provides a method for assembling the bent spacer module described above, including: tearing off the first release film; attaching a surface, from which the first release film is torn off, of the bent spacer to the back surface of the display module; tearing off the second release film; and attaching a surface, from which the second release film is torn off, of the bent spacer to the driving chip.

DETAIL DESCRIPTION OF EMBODIMENTS

In order to make the purpose, technical solution and advantages of the embodiments of the present disclosure more clear, the technical solutions in the embodiments of the present disclosure will be described clearly and completely in combination with the drawings of the embodiments of the present disclosure. It should be noted that the dimensions and shapes of the components in the drawings do not reflect the true scale, and are only intended to illustrate the inventive concept of the present disclosure. The same or similar labels throughout represent the same or similar components or components with the same or similar functions. Obviously, the described embodiments are only a part but not all of the embodiments of the present disclosure. Based on the described embodiments of the present disclosure, all other embodiments obtained by those skilled in the art without creative labor fall within the protection scope of the present disclosure.

Unless defined otherwise, technical or scientific terms used herein shall have the ordinary meaning as understood by those skilled in the art to which the present disclosure belongs. The terms "first," "second," and the like, as used in the description and in the claims, do not denote any order, quantity, or importance, but rather are used to distinguish one element from another. The word "include" or "comprise", or the like, means that the element or item preceding the word contains the element or item listed after the word and its equivalent, but does not exclude other elements or items. "Inner", "outer", "upper", "lower", and the like are used merely to indicate relative positional relationships, and when the absolute position of the described object changes, the relative positional relationships may change accordingly.

In the related art, in order to ensure the narrow border where the display module is bound to the Chip On Film (COF), two bending methods are generally adopted. One of the two bending methods includes: bending a border of the display module attached to the COF towards a back surface of the display module; the other method includes: binding the COF to a display surface of the display module, and bending the COF toward the back surface of the display module. After the display module and the COF are bent in above two methods, a bent spacer may attach the bent COF or the bent display module to a heat dissipation film (SCF) on the back surface of the display module. Generally, a region in which a driving chip or a driver IC (DIC) is located is near the bending region. The driving chip bound with the COF is also adhered to the bent spacer in the actual product, so as to prevent, through the buffering effect of the bent spacer, the driving chip from being damaged in the strength tests such as the whole product falling test, rolling test, or pressing test. However, with the development trend that the border where the display module is bound to the COF becomes narrower and narrower, a bending radius becomes smaller and smaller, so that a space between the bent COF or the bent display module and the heat dissipation film becomes smaller and smaller, and in turn the bent spacer disposed between the bent COF or the bent display module and the heat dissipation film becomes thinner and thinner. However, it is difficult for the thinner bent spacer to buffer and protect the driving chip.

Figure 1:
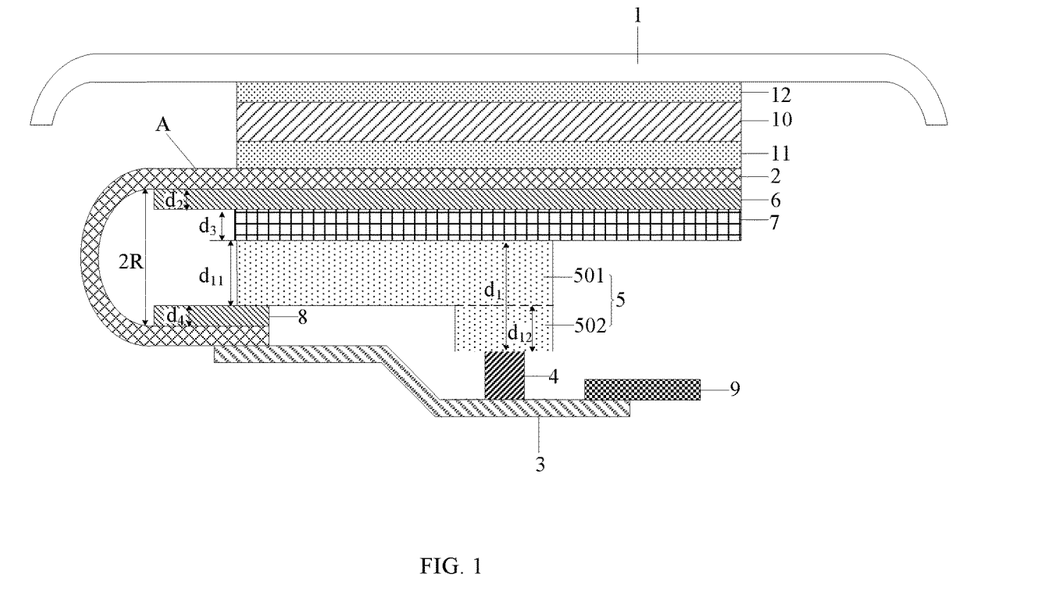
FIG. 1 is a schematic cross-sectional view showing a structure of a display device according to an embodiment of the present disclosure.
Figure 2:
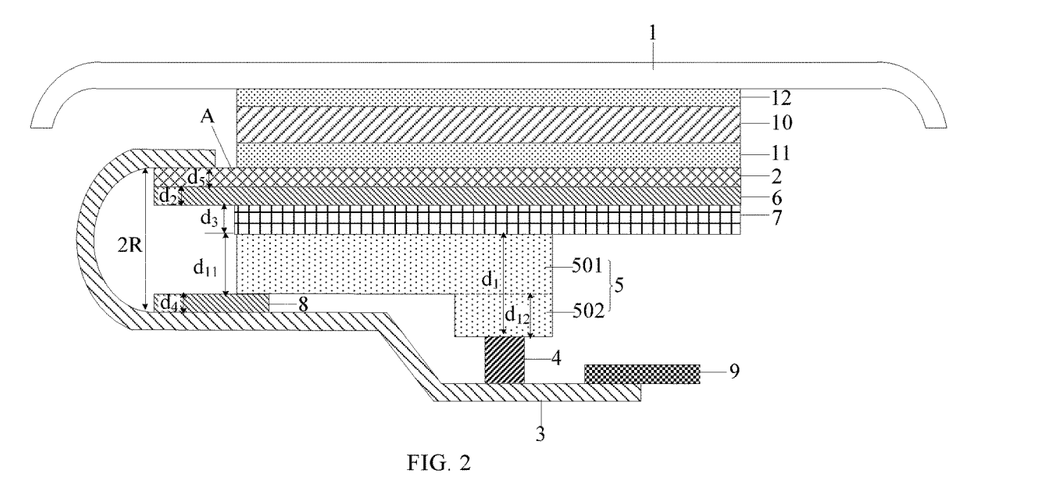
FIG. 2 is a schematic cross-sectional view showing a structure of a display device according to another embodiment of the present disclosure.

In view of the above problem in the related art, an embodiment of the present disclosure provides a display device, as shown in FIG. 1 and FIG. 2, including: a protective cover plate 1; a display module 2 including a display surface A facing the protective cover plate 1 and a back surface away from the protective cover plate 1; a COF 3, wherein at least a portion of the COF 3 is located on the back surface and bound and connected to an edge (i.e., an edge area of the display surface A) of the display module 2; a driving chip 4, on a side, proximal to the display module 2, of the COF 3 on the back surface and bound and connected to the COF 3; and a bent spacer 5 between the driving chip 4 and the back surface, and a portion of the bent spacer 5 in contact to the driving chip 4 has a thickness greater than a thickness of a remaining portion of the bent spacer 5.

In the display device according to the embodiment of the present disclosure, the portion of the bent spacer 5 in contact to the driving chip 4 has a thickness greater than the thickness of the remaining portion of the bent spacer 5, so that the remaining portion which has a thinner thickness is adhered to the bent display module 2 or the bent COF 3. Meanwhile, the portion, which has a greater thickness and is in contact to the driving chip 4, of the bent spacer 5 may protect the driving chip 4 through the buffer function, thereby ensuring the original adhering function of the bent spacer 5, while effectively solving the technical problem in the related art that the bent spacer 5 is too thin to protect the driving chip 4. In addition, since the bent spacer 5 has double functions of adhesion and buffering, the adhesion of the bent display module 2 or the bent COF 3 and the buffering protection on the driving chip 4 respectively realized by using two bounding devices through two bounding processes can be avoided, so that the production efficiency of a production line can be ensured without additional bounding devices.

Optionally, in the display device in the embodiment of the present disclosure, as shown in FIG. 1 to FIG. 4, the bent spacer 5 includes: a first film layer 501 and a second film layer 502 stacked on the first film layer 501. The second film layer 502 is in contact with the driving chip 4, and an area (i.e., a dimension) of the second film layer 502 is smaller than an area (i.e., a dimension) of the first film layer 501. It can be understood that the first film layer 501 in the present disclosure may be equivalent to a bent spacer in the related art. Specifically in the present disclosure, the second film layer 502 is formed in a region of the first film layer 501 corresponding to the driving chip 4 to achieve the buffer protection effect on the driving chip 4. Alternatively, the second film layer 502 may have a shape of a cuboid, a prism, a cylinder, a trapezoidal mesa, or the like.

Optionally, in the display device in the embodiment of the present disclosure, the first film layer 501 and the second film layer 502 may be formed as a one-piece structure, or alternatively may be formed as two independent film layers, which is not limited herein. It should be understand that the bent spacer 5 including the first film layer 501 and the second film layer 502 may be an organic double-sided adhesive tape or an inorganic double-sided adhesive tape, when the first film layer 501 and the second film layer 502 are formed as a one-piece structure; and that the first film layer 501 is an organic double-sided adhesive tape or an inorganic double-sided adhesive tape and the second film layer 502 has a single-sided adhesive tape (e.g., a grid tape or a foam tape) on a surface of the second film layer 502 in contact with the driving chip 4, when the first film layer 501 and the second film layer 502 are formed as two independent film layers.

Figure 5:
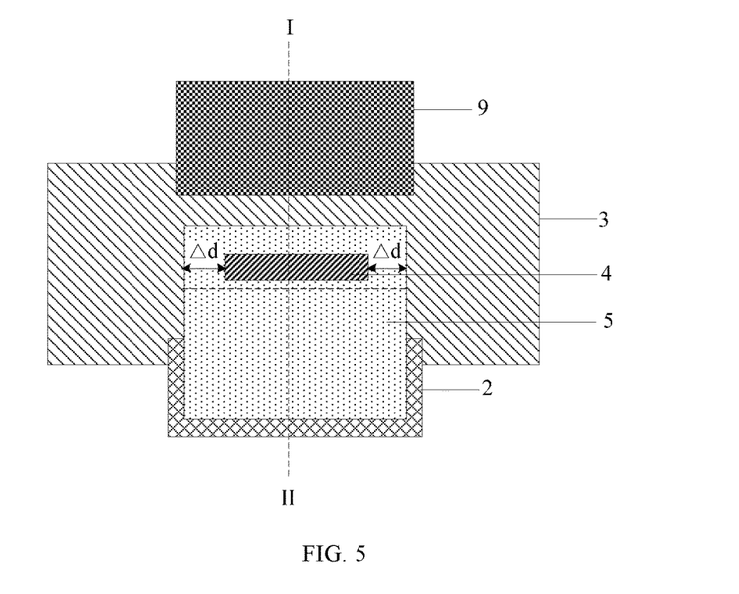
FIG. 5 is a bottom view showing a display device according to an embodiment of the present disclosure.

Optionally, in the above display device in the embodiment of the present disclosure, as shown in FIG. 1, FIG. 2, and FIG. 5, an orthographic projection of the second film layer 502 on a plane where the driving chip 4 is located overlaps the entire driving chip 4 (i.e., completely overlaps the driving chip 4), so as to achieve effective protection on the driving chip 4. Optionally, as shown in FIG. 5, the difference Δd between a lateral dimension of the second film layer 502 and a lateral dimension of the driving chip 4 is greater than or equal to 1 mm.

Optionally, in the display device in the embodiment of the present disclosure, in order to better protect the driving chip 4 and make the entire product thinner, as shown in FIG. 1 and FIG. 2, along a direction perpendicular to the plane where the bent spacer 5 is located, a sum d1 of a thickness d11 of the first film layer 501 and a thickness d12 of the second film layer 502 is greater than or equal to 0.2 mm. An upper limit of the sum d1 may be adjusted according to the space reserved for the driving chip. For example, when the space reserved for the driving chip is 0.1 mm, the sum d1 may be less than or equal to 0.3 mm. In addition, if the space reserved for the driving chip 4 is larger, the value of the sum d1 may be increased accordingly, so that the driving chip 4 can be fully protected.

Optionally, in the display device in the embodiment of the present disclosure, in order to ensure that the relatively narrow binding border, as shown in FIG. 1, an edge of the display module 2 bound with COF is bent towards the back surface, such that the entire COF 3 is located on the back surface. Alternatively, as shown in FIG. 2, an edge (i.e. an edge on a side) of the COF 3 is bound and connected to an edge of the display module 2 on the display surface A of the display module 2, and another edge (i.e., an edge on the other side) of the COF 3 is bent to the back surface from the display surface A.

Figure 3:
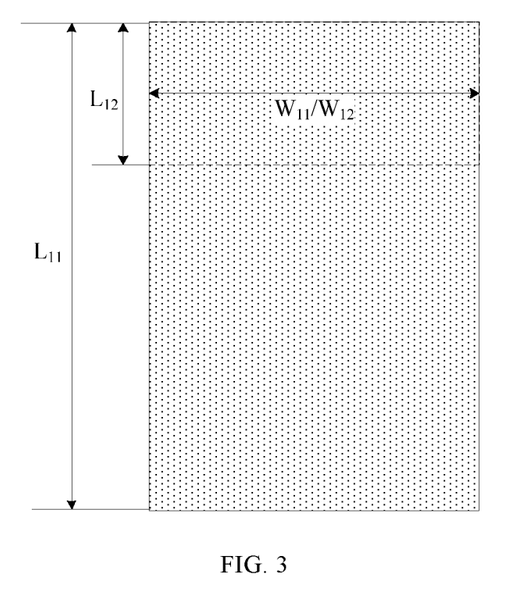
FIG. 3 is a front view showing a bent spacer according to an embodiment of the present disclosure.
Figure 4:
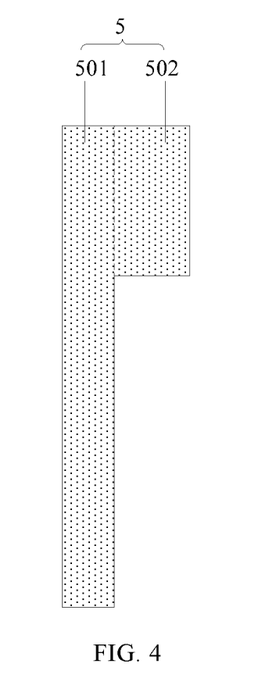
FIG. 4 is a side view showing a bent spacer according to an embodiment of the present disclosure.

Alternatively, in the above display device in the embodiment of the present disclosure, in order to facilitate the shape cutting of the bent spacer 5, as shown in FIG. 1 to FIG. 3, along a direction of a bending axis (i.e., a direction perpendicular to the paper in FIG. 1 and FIG. 2), a width $W_{11}$ of the first film layer 501 is the same as a width $W_{12}$ of the second film layer 502. Optionally, each of the widths $W_{11}$ and $W_{12}$ is greater than or equal to 7 mm and less than or equal to 12 mm. Preferably, in order to further facilitate the shape cutting of the bent spacer 5, as shown in FIG. 1 and FIG. 2, a surface of the bent spacer 5 away from the bending axis (i.e., the surface on the right) is a vertical surface. Optionally, along a direction perpendicular to the vertical surface, a length $L_{11}$ of the first film layer 501 is greater than or equal to 8 mm and less than or equal to 15 mm, and a length $L_{12}$ of the second film layer 502 is greater than or equal to 3 mm and less than or equal to 7 mm.

Optionally, in the display device in the embodiment of the present disclosure, as shown in FIG. 1 and FIG. 2, the display device may further include: a first back film 6 and a heat dissipation film 7 sequentially located on the back surface proximal to the bent spacer 5 in an order of the first back film 6 and the heat dissipation film 7, and a second back film 8 on a side of the bent spacer 5 away from the back surface.

Along a direction perpendicular to the plane where the bent spacer 5 is located, the thickness $d_{11}$ of the first film layer 501 is smaller than or equal to a difference between the bending diameter 2R and a sum of a thickness $d_2$ of the first back film 6, a thickness $d_3$ of the heat dissipation film 7 and a thickness $d_4$ of the second back film 8. Specifically, in FIG. 1, the thickness $d_{11}$ of the first film layer 501 is equal to a difference between the bending diameter 2R and the sum of the thickness $d_2$ of the first back film 6, the thickness $d_3$ of the heat dissipation film 7, the thickness $d_4$ of the second back film 8, and a thickness $d_5$ of the display module 2. That is, the thickness $d_{11}$ the first film layer 501 is smaller than the difference between the bending diameter 2R and the sum of the thickness $d_2$ of the first back film 6, the thickness $d_3$ of the heat dissipation film 7, and the thickness $d_4$ of the second back film 8. In FIG. 2, the thickness $d_{11}$ of the first film layer 501 is equal to the difference between the bending diameter 2R and the sum of the thickness $d_2$ of the first back film 6, the thickness $d_3$ of the heat dissipation film 7, and the thickness $d_4$ of the second back film 8.

Figure 6:
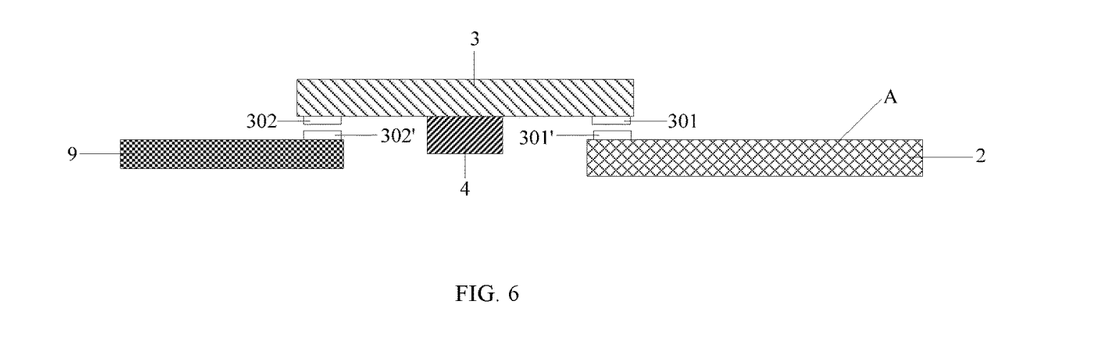
FIG. 6 is a cross-sectional view taken along line I-II in FIG. 5.

Optionally, in the display device in the embodiment of the present disclosure, as shown in FIG. 1, FIG. 2, and FIG. 6, the display device may further include: a flexible circuit board 9 bound and connected to the COF 3.

The COF 3 includes: a first terminal 301 bound with the display module 2, and a second terminal 302 bound with the flexible circuit board 9. Both of the first terminal 301 and the second terminal 302 are located on the same side of the COF 3 bound with the driving chip 4. In general, as shown in FIG. 6, the display module 2 includes a display terminal 301' in one-to-one correspondence with the first terminal 301, and the flexible circuit board 9 includes a connection terminal 302' in one-to-one correspondence with the second terminal 302.

In a case where the first terminal 301 and the second terminal 302 are located on a side different from the driving chip 4, the COF 3 should be formed as a double-layer board, thereby resulting in a relatively high cost. In the present disclosure, the first terminal 301 and the second terminal 302 are disposed on the same side as the side of the COF 3 bound to the driving chip 4, so that the COF 3 may be formed as a single-layer board, thereby reducing the cost.

Generally, in the above display device in the embodiment of the present disclosure, as shown in FIG. 1 and FIG. 2, the display device may further include: a polarizer 10 on the display surface A of the display module 2, a first optical adhesive (e.g., optical clear adhesive, OCA) layer 11 between the display module 2 and the polarizer 10, and a second optical adhesive layer 12 between the polarizer 10 and the protective cover plate 1.

Based on the same inventive concept, an embodiment of the present disclosure provides a bent spacer module. The principle of the bent spacer module for solving the problem is similar to that of the display device, so the implementation of the bent spacer module according to the embodiment of the present disclosure may refer to the implementation of the display device according to the embodiment of the present disclosure, and the implementation of the bent spacer module will not be described again.

Figure 7:
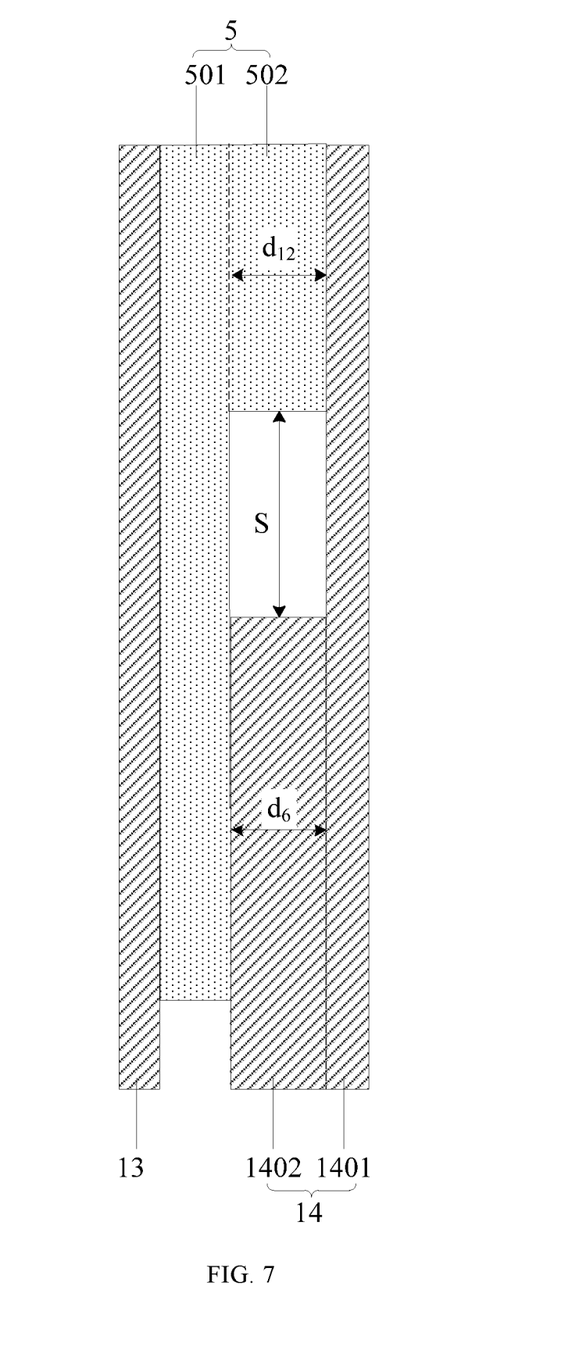
FIG. 7 is a side view showing a bent spacer module according to an embodiment of the present disclosure.

Specifically, as shown in FIG. 7, the bent spacer module according to the embodiment of the present disclosure includes: a bent spacer 5 which is the bent spacer 5 in the display device described above; a first release film 13 on a side of the bent spacer 5 to be attached to the back surface of the display module 2; and a second release film 14 on a side of the bent spacer 5 to be attached to the driving chip 4.

In a membrane adhesion factory, in general the bent spacer 5 is adhered to the back surface of display module 2 by using a roller wheel. Therefore, there shall be no height difference on the surface of the second release film 14 when the bent spacer 5 is adhered by using the roller wheel. However, since the bent spacer 5 itself has a height difference, it is inevitable that the surface of the second release film 14 has a height difference in a case where the second release film 14 is a conventional release film having a constant thickness, which is unfavorable for adhering the bent spacer 5 by using the roller wheel. The present disclosure provides a new design for the structure of the second release film 14. As shown in FIG. 7, a portion of the second release film 14 in contact with the first film layer 501 has a thickness greater than a thickness of the remaining portion of the second release film 14, thereby decreasing the height difference on the surface of the second release film 14.

Figure 8:
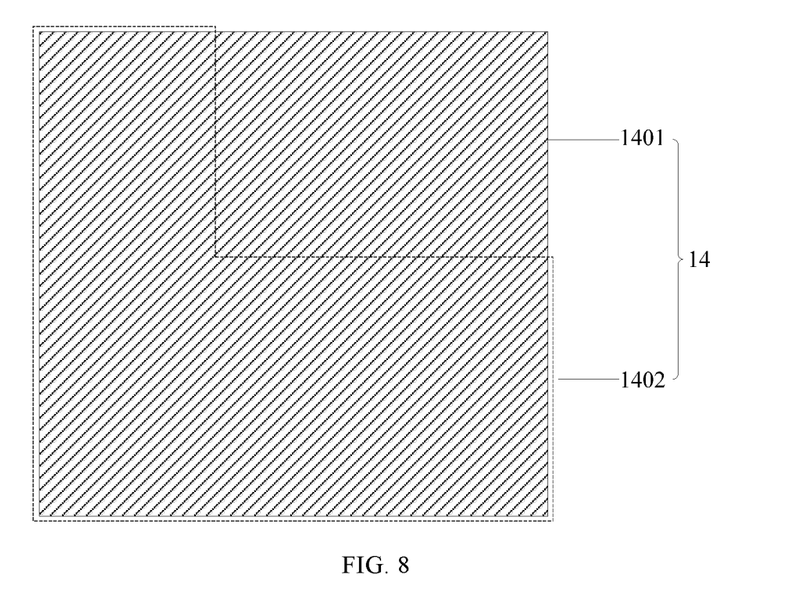
FIG. 8 is a top view showing a second release film according to an embodiment of the present disclosure.

Optionally, in the above bent spacer module in the embodiment of the present disclosure, as shown in FIG. 7 and FIG. 8, the second release film 14 includes: a third film layer 1401 and a fourth film layer 1402 stacked on the third film layer 1401. The fourth film layer 1402 is in contact with the first film layer 501, and an area (i.e., a size) of the fourth film layer 1402 is smaller than an area (i.e., a size) of the third film layer 1401. It can be understood that the third film layer 1401 in the present disclosure may be equivalent to a conventional release film with an equal thickness in the related art. Specifically in the present disclosure, the fourth film layer 1402 is disposed in a region of the third film layer 1401 corresponding to the first film layer 501 and not overlapped the second film layer 502, so that the second release film 14 can match with the bent spacer 5 having a special-shaped structure, which facilitates attaching the bent spacer module to the back surface of the display module 2 by using the roller wheel.

Optionally, in the bent spacer module in the embodiment of the present disclosure, as shown in FIG. 7, along a direction perpendicular to a plane where the bent spacer 5 is located, a thickness $d_6$ of the fourth film layer 1402 is the same as the thickness $d_{12}$ of the second film layer 502, so as to decrease the height difference to the maximum extent.

Optionally, in the bent spacer module in the embodiment of the present disclosure, as shown in FIG. 7, an orthographic projection of the fourth film layer 1402 on the plane where the bent spacer 5 is located does not overlap the second film layer 502. The reason for such an arrangement is that when the second release film 14 is attached to the bent spacer 5, a side surface of the fourth film layer 1402 would be attached to a side surface of the second film layer 502 if no gap exists between the fourth film layer 1402 and the second film layer 502, so that the surface of the third film layer 1401 presents an uneven surface having protrusions, which results in that the bent spacer module cannot be attached to the back surface of the display module 2 by using the roller wheel. Optionally, a distance S between the fourth film layer 1402 and the second film layer 502 is greater than or equal to 0.3 mm and less than or equal to 0.8 mm, preferably the distance S is 0.5 mm.

Figure 9:
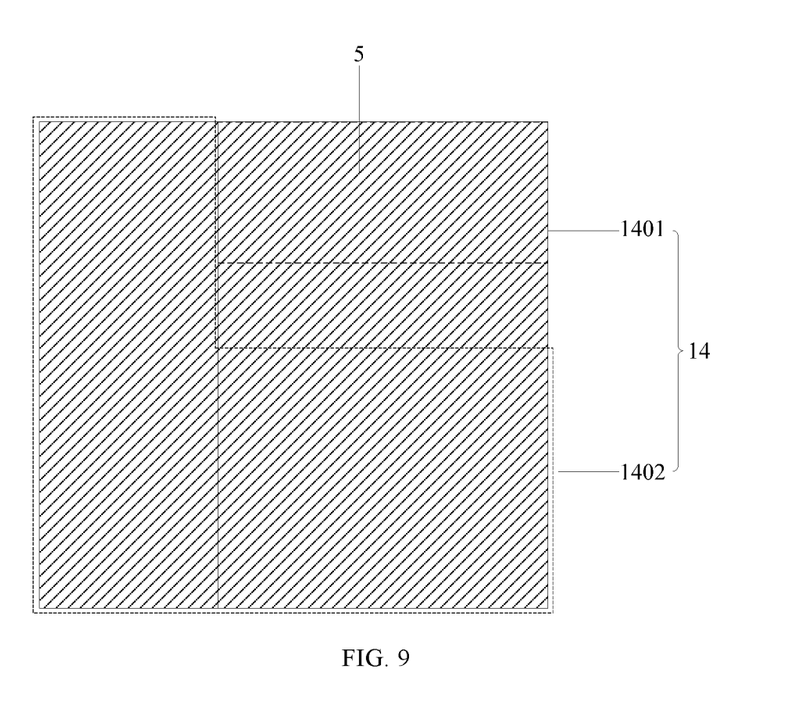
FIG. 9 is a top view showing a bent spacer module according to an embodiment of the present disclosure.

Optionally, in the bent spacer module in the embodiment of the present disclosure, as shown in FIG. 7 and FIG. 9, a region where an orthographic projection of the fourth film layer 1402 on the plane of the bent spacer 5 does not overlap the first film layer 501 overlaps the entire (i.e., completely overlaps) region where an orthographic projection of the third film layer 1401 on the plane of the bent spacer 5 does not overlap the first film layer 501. With such an arrangement, the third film layer 1401 and the fourth film layer 1402 which protrude from the first film layer 501 can serve as a tearing handle, so that the fourth film layer 1402 which fills up the height difference of the bent spacer 5 is torn off without remaining on the product when the first film layer 501 is torn off. Both of the third film layer 1401 and the fourth film layer 1402 may be torn off together by adjusting the adhesion between the third film layer 1401 and the fourth film layer 1402. However in actual application, the adhesion between the third film layer 1401 and the fourth film layer 1402 is unstable, so that the third film layer 1401 and the fourth film layer 1402 can be torn off together sometimes, and cannot be torn off together sometimes, which leads to that the device operates normally sometimes, and gives an alarm sometimes, which is not beneficial to mass production.

Optionally, in the bent spacer module in the present disclosure, the third film layer 1401 and the fourth film layer 1402 may be formed as a one-piece structure, or alternatively may be formed as two independent film layers, which is not limited herein.

Optionally, in the bent spacer module in the embodiment of the present disclosure, since the first release film 13 is in contact with and adhered to the first film layer 501 having a uniform thickness, the first release film 13 may be a film having an equal thickness, and no special design is made to the first release film 13.

Correspondingly, an embodiment of the present disclosure provides an method for assembling the bent spacer module, which includes: tearing off the first release film; attaching a surface, from which the first release film is torn off, of the bent spacer to the back surface of the display module; wherein specifically, the first film layer of the bent spacer is attached to the heat dissipation film on the back surface of the display module by using a roller wheel; tearing off the second release film; and attaching a surface, from which the second release film is torn off, of the bent spacer to the driving chip.

In the above-mentioned display device, bent spacer module and assembling method thereof in the embodiments of the present disclosure, the display device includes: a protective cover plate; the display module including a display surface facing the protective cover plate and a back surface away from the protective cover plate; a COF, wherein at least a portion of the COF is located on the back surface and bound and connected with an edge of the display module; a driving chip on a side, proximal to the display module, of the COF on the back surface, and bound with and connected to the COF; and a bent spacer between the driving chip and the back surface, wherein a portion of the bent spacer in contact with the driving chip has a thickness greater than a thickness of the remaining portion of the bent spacer. Since the portion of the bent spacer in contact with the driving chip has a thickness greater than a thickness of the remaining portion of the bent spacer, the remaining portion having a thinner thickness is adhered to the bent display module 2 or the bent COF 3. Meanwhile, the portion of the bent spacer 5 in contact to the driving chip 4 having a greater thickness may protect the driving chip 4 through buffer function, thereby ensuring the original adhering function of the bent spacer 5, while effectively solving the technical problem in the related art that the bent spacer 5 is too thin to protect the driving chip 4.

Various modifications and variations to the embodiments of the present disclosure can be made by those skilled in the art without departing from the spirit or scope of the embodiments of the disclosure. Thus, if such modifications and variations to the embodiments of the present disclosure fall within the scope of the claims of the present disclosure and their equivalents, the present disclosure is also intended to encompass these modifications and variations.

What is claimed is:

1. A display device, comprising:
   a protective cover plate;
   a display module comprising a display surface facing the protective cover plate and a back surface away from the protective cover plate;
   a Chip On Film (COF) at least partially located on the back surface and bound and connected with an edge of the display module;
   a driving chip on a side, proximal to the display module, of the COF on the back surface, and bound and connected with the COF, wherein one end of the Chip On Film is directly connected to the display module and the other end of the Chip On Film is directly connected to the driving chip, such that the driving chip is connected to the display module via the Chip On Film; and
   a bent spacer between the driving chip connected to the display module via the Chip On Film and the back surface, wherein the bent spacer comprises a first film layer not in direct contact with the driving chip and a second film layer stacked on the first film layer and is in contact with the driving chip connected to the display module via the Chip On Film,
   a sum of a thickness of the second film layer in contact with the driving chip connected to the display module via the Chip On Film and a thickness of the first film layer stacked on the second film layer is greater than a thickness of the first film layer not in contact with the driving chip.

2. The display device of claim 1, wherein
   an area of the second film layer is smaller than an area of the first film layer.

3. The display device of claim 2, wherein
   the first film layer and the second film layer have a one-piece structure.

4. The display device of claim 2, wherein an orthographic projection of the second film layer on a plane where the driving chip is located overlaps the entire driving chip.

5. The display device of claim 2, wherein along a direction perpendicular to a plane where the bent spacer is located, a sum of a thickness of the first film layer and a thickness of the second film layer is greater than or equal to 0.2 mm.

6. The display device of claim 2, wherein the edge of the display module bound with the COF is bent towards the back surface such that the entire COF is on the back surface.

7. The display device of claim 2, wherein an edge of the COF is bound and connected with the edge of the display module on the display surface, and an opposite edge of the COF is bent to the back surface from the display surface.

8. The display device of claim 6, wherein along a direction of a bending axis, a width of the first film layer is the same as a width of the second film layer.

9. The display device of claim 8, wherein each of the first film layer and the second film layer has a width greater than or equal to 7 mm and less than or equal to 12 mm.

10. The display device of claim 6, wherein a surface of the bent spacer away from a bending axis is a vertical surface.

11. The display device of claim 10, wherein along a direction perpendicular to the vertical surface, a length of the first film layer is greater than or equal to 8 mm and less than or equal to 15 mm, and a length of the second film layer is greater than or equal to 3 mm and less than or equal to 7 mm.

12. The display device of claim 6, further comprising: a first back film and a heat dissipation film sequentially on a side of the back surface proximal to the bent spacer, and a second back film on a side of the bent spacer away from the back surface, wherein
    along a direction perpendicular to a plane where the bent spacer is located, the first film layer has a thickness smaller than or equal to a difference between a bending diameter and a sum of a thickness of the first back film, a thickness of the heat dissipation film and a thickness of the second back film.

13. The display device of claim 1, further comprising: a flexible circuit board bound and connected with the COF; wherein
    the COF comprises a first terminal bound and connected with the display module, and a second terminal bound and connected with the flexible circuit board, and
    both the first terminal and the second terminal are on a side of the COF bound with the driving chip.

14. A bent spacer module, comprising:
    a bent spacer being the bent spacer in the display device according to claim 1;
    a first release film on a side of the bent spacer to be attached to the back surface of the display module; and
    a second release film on a side of the bent spacer to be attached to the driving chip.

15. The bent spacer module of claim 14, wherein the second release film comprises: a third film layer and a fourth film layer stacked on the third film layer, wherein
    the fourth film layer is in contact with the first film layer, and the fourth film layer has an area smaller than an area of the third film layer,
    along a direction perpendicular to a plane where the bent spacer is located, the fourth film layer has a thickness equal to a thickness of the second film layer, and
    an orthographic projection of the fourth film layer on the plane where the bent spacer is located does not overlap the second film layer.

16. The bent spacer module of claim 15, wherein the third film layer and the fourth film layer have a one-piece structure.

17. A method for assembling the bent spacer module of claim 15, comprising:
    tearing off the first release film;
    attaching a surface, from which the first release film is torn off, of the bent spacer to the back surface of the display module;
    tearing off the second release film; and
    attaching a surface, from which the second release film is torn off, of the bent spacer to the driving chip.

18. A display device, comprising:

a protective cover plate;

a display module comprising a display surface facing the protective cover plate and a back surface away from the protective cover plate;

a Chip On Film (COF) at least partially located on the back surface and bound and connected with an edge of the display module;

a driving chip on a side, proximal to the display module, of the COF on the back surface, and bound and connected with the COF, wherein one end of the Chip On Film is directly connected to the display module and the other end of the Chip On Film is directly connected to the driving chip, such that the driving chip is connected to the display module via the Chip On Film; and a bent spacer between the driving chip connected to the display module via the Chip On Film and the back surface, wherein the bent spacer comprises a first film layer not in direct contact with the driving chip and a second film layer stacked on the first film layer and is in contact with the driving chip connected to the display module via the Chip On Film, a sum of a thickness of the second film layer in contact with the driving chip connected to the display module via the Chip On Film and a thickness of the first film layer stacked on the second film layer is greater than a thickness of the first film layer not in contact with the driving chip, and an area of the second film layer is smaller than an area of the first film layer, the first film layer and the second film layer have a one-piece structure, an orthographic projection of the second film layer on a plane where the driving chip is located overlaps the entire driving chip.

* * * * *